United States Patent
Do et al.

(10) Patent No.: US 8,612,812 B2
(45) Date of Patent: *Dec. 17, 2013

(54) SEMICONDUCTOR MEMORY DEVICE, TEST CIRCUIT, AND TEST OPERATION METHOD THEREOF

(75) Inventors: Chang-Ho Do, Gyeonggi-do (KR); Bok-Moon Kang, Dublin, CA (US); Tae-Hyung Jung, Santa Clara, CA (US)

(73) Assignee: Hynix Semiconductor Inc., Gyeonggi-do (KR)

( * ) Notice: Subject to any disclaimer, the term of this patent is extended or adjusted under 35 U.S.C. 154(b) by 318 days.

This patent is subject to a terminal disclaimer.

(21) Appl. No.: 12/982,607

(22) Filed: Dec. 30, 2010

(65) Prior Publication Data

US 2012/0173937 A1    Jul. 5, 2012

(51) Int. Cl.
*G11C 29/00* (2006.01)
(52) U.S. Cl.
USPC .......................................................... 714/719
(58) Field of Classification Search
USPC ................................................. 714/718, 719
See application file for complete search history.

(56) References Cited

U.S. PATENT DOCUMENTS

| 4,315,247 | A  | * | 2/1982  | Germanton ..................... 340/5.6 |
| 6,058,495 | A  | * | 5/2000  | Lee et al. ...................... 714/718 |
| 6,550,026 | B1 | * | 4/2003  | Wright et al. ................. 714/719 |
| 7,246,280 | B2 |   | 7/2007  | Kim et al. |
| 2006/0291299 | A1 | * | 12/2006 | Nanba ...................... 365/189.07 |
| 2008/0222460 | A1 | * | 9/2008 | Kim et al. ..................... 714/702 |
| 2009/0037784 | A1 | * | 2/2009 | Kim et al. ..................... 714/719 |

FOREIGN PATENT DOCUMENTS

KR    1020090122677    12/2009
KR    1020100050138    5/2010

* cited by examiner

*Primary Examiner* — Michael Maskulinski
*Assistant Examiner* — Neil Miles
(74) *Attorney, Agent, or Firm* — IP & T Group LLP

(57) ABSTRACT

A semiconductor memory device includes a plurality of banks, each including a plurality of first memory cells and a plurality of second memory cells, a first input/output unit configured to transfer first data between the first memory cells and a plurality of first data pads; a second input/output unit configured to transfer second data between the second memory cells and a plurality of second data pads, a path selection unit configured to transfer the first data, which are input through the first data pads, to both the first and second memory cells, during a test mode, and a test mode control unit configured to compare the first data of the first and second memory cells, and to control at least one of the first data pads to denote a fail status based on a comparison result, during the test mode.

25 Claims, 8 Drawing Sheets

SEMICONDUCTOR MEMORY DEVICE, TEST CIRCUIT, AND TEST OPERATION METHOD THEREOF

BACKGROUND OF THE INVENTION

Exemplary embodiments of the present invention relate to semiconductor memory devices, and more particularly, to a semiconductor memory device, a test circuit and a test operation method thereof.

A dynamic random access memory (DRAM), which is widely used among memory devices, includes a plurality memory cells for storing data. As the number of memory cells integrated in the semiconductor memory device increases, more time and money are consumed for testing the memory cells in the semiconductor memory device. Therefore, a parallel test scheme has been developed and applied to test memory cells of a semiconductor memory device at a wafer or a package level.

According to the parallel test scheme, test data are inputted to two or more memory cells in a bank of a semiconductor memory device. The memory cells store and output the test data. The outputted test data are compared to determine whether or not the memory cells have a defect.

A conventional semiconductor memory device includes an additional pin on a test chip to output the comparison result, i.e., a test result. Furthermore, where the semiconductor memory device is used as a memory module, in which plural chips are modularized, there are demands for a circuitry that may test a semiconductor memory device in a module state. When such a test is performed on a semiconductor memory device that is mounted on a system, the test is called a mounting test. Further, the conventional semiconductor memory device includes an additional test pin on a chip to output the comparison result, i.e., a test result. In order to reduce the chip size, there are demands for a circuitry that may test a semiconductor memory device without the additional test pin, and decrease a test time.

SUMMARY OF THE INVENTION

Exemplary embodiments of the present invention are directed to a semiconductor memory device capable of decreasing a test time of a plurality of unit cells.

In accordance with an exemplary embodiment of the present invention, a semiconductor memory device includes a plurality of banks, each including a plurality of first memory cells and a plurality of second memory cells, a first input/output unit configured to transfer first data between the first memory cells and a plurality of first data pads, a second input/output unit configured to transfer second data between the second memory cells and a plurality of second data pads, a path selection unit configured to transfer the first data, which are input through the first data pads, to both the first and second memory cells, during a test mode, and a test mode control unit configured to compare the first data of the first and second memory cells, and to control at least one of the first data pads to denote a fail status based on a comparison result, during the test mode, wherein the test mode control unit controls the one of the first data pads to a high-impedance state during a read operation.

In accordance with another exemplary embodiment of the present invention, a method of testing a semiconductor memory device includes transferring data, which is input through a data pad, to first and second memory cells of a bank comparing the data of the first memory cell with the data of the second memory cell to output a fail detection signal based on the comparison result generating a fail latch signal by latching the fail detection signal in response to a test mode signal which is activated during the test mode, and a strobe signal which is toggled when a read command is input generating a fail signal based on the fail latch signal and the test mode signal and driving at least one of the data pad to denote a fail status based on the fail signal, wherein the data is driven to a high-impedance state during a read operation.

DESCRIPTION OF SPECIFIC EMBODIMENTS

Figure 1:
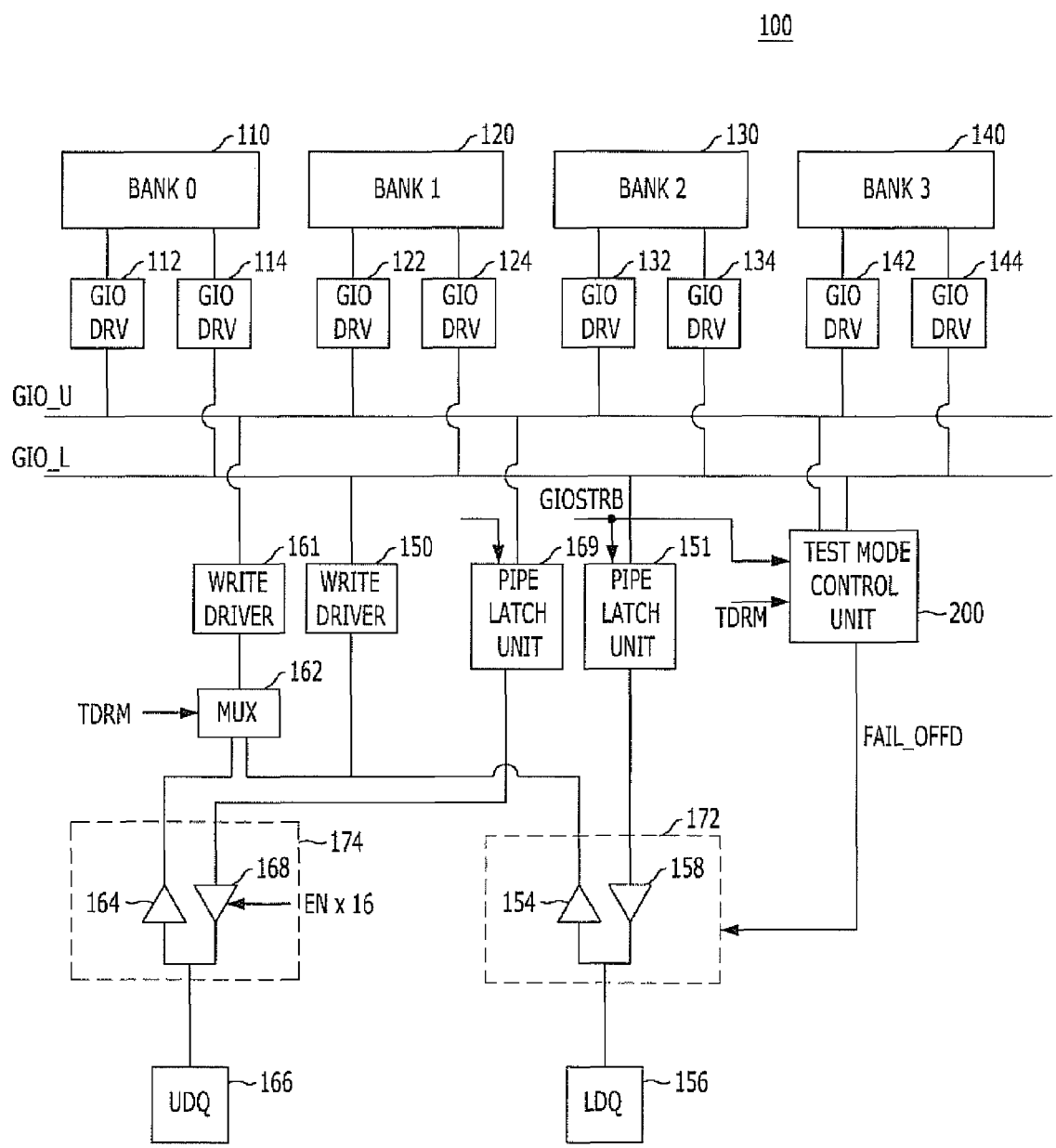
FIG. 1 illustrates a block diagram illustrating a semiconductor memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor memory device in accordance with an exemplary embodiment of the present invention.

Referring to FIG. 1, the semiconductor memory device includes a plurality of banks, for example, four banks, 110 to 140, global input/output (GIO) line drivers 112 to 144, write drivers 150 and 161, pipe latch units 151 and 169, a multiplexer 162, input/output (I/O) drivers 172 and 174, and a test mode control unit 200.

The I/O drivers 172 and 174 are configured to drive data inputted/outputted from/to data pads LDQ and UDQ, respectively. In more detail, the I/O drivers 172 and 174 are provided with input buffers 154 and 164 and output drivers 158 and 168, respectively. The input buffers 154 and 164 receive data inputted from the data pads LDQ and UDQ, respectively. The input buffer 154 outputs the data it receives to the write driver 150 and the multiplexer 162. The input buffer 164 outputs the data it receives to the multiplexer 162. Further, the output driver 158 and 168 receive data outputted from the pipe latch units 151 and 169, and output data to the data pads LDQ and UDQ, respectively. In accordance with this exemplary embodiment of the present invention, in a test mode, the output driver 158 drives the data pad LDQ to a high-impedance state in response to a fail-off signal FAIL_OFFD.

The write drivers 150 and 161 transfer data to corresponding memory cells of the banks 110 to 140. The pipe latch units 151 and 169 output data of the corresponding GIO lines GIO_L and GIO_U to the data pads LDQ and UDQ through the output drivers 158 and 168, respectively. The memory cells included in the banks 110 to 140 store data and output the stored data through the corresponding GIO lines GIO_L and GIO_U.

In accordance with this exemplary embodiment of the present invention, in the test mode, the multiplexer 162 selects a path between the write driver 161 and the input buffer 154 in response to a test mode signal TDRM. Here, the test mode signal TDRM is a signal which is activated during the test mode of a semiconductor memory device. As a result, while the write driver 150 transfers test data inputted from the data pad LDQ to memory cells coupled to the GIO lines GIO_L, the write driver 161 also transfers the same test data inputted from the data pad LDQ to memory cells coupled to the GIO lines GIO_U. That is, both of the write drivers 150 and 161 receive the test data from the data pad LDQ and transfer the test data to respective memory cells in the banks 110 to 140.

In a normal mode, the multiplexer 162 selects a path between the write driver 161 and the input buffer 164 in response to the test mode signal TDRM which is inactivated during the normal mode. As a result, the write driver 150 transfers data inputted from the data pad LDQ to its corresponding memory cells, i.e., memory cells coupled to GIO lines GIO_L, and the write driver 161 transfers data inputted from the data pad UDQ to its corresponding memory cells, i.e., memory cells coupled to GIO lines GIO_U. That is, each of the write drivers 150 and 161 receives and transfers respective data from the data pads LDQ and UDQ to memory cells in the banks 110 to 140.

The test mode control unit 200 receives data outputted from the GIO lines GIO_L and GIO_U. In the test mode, the test mode control unit 200 compares data of the GIO lines GIO_U with data of the GIO lines GIO_L in response to the test mode signal TDRM, and outputs the fail-off signal FAIL_OFFD based on a comparison result.

Figure 2:
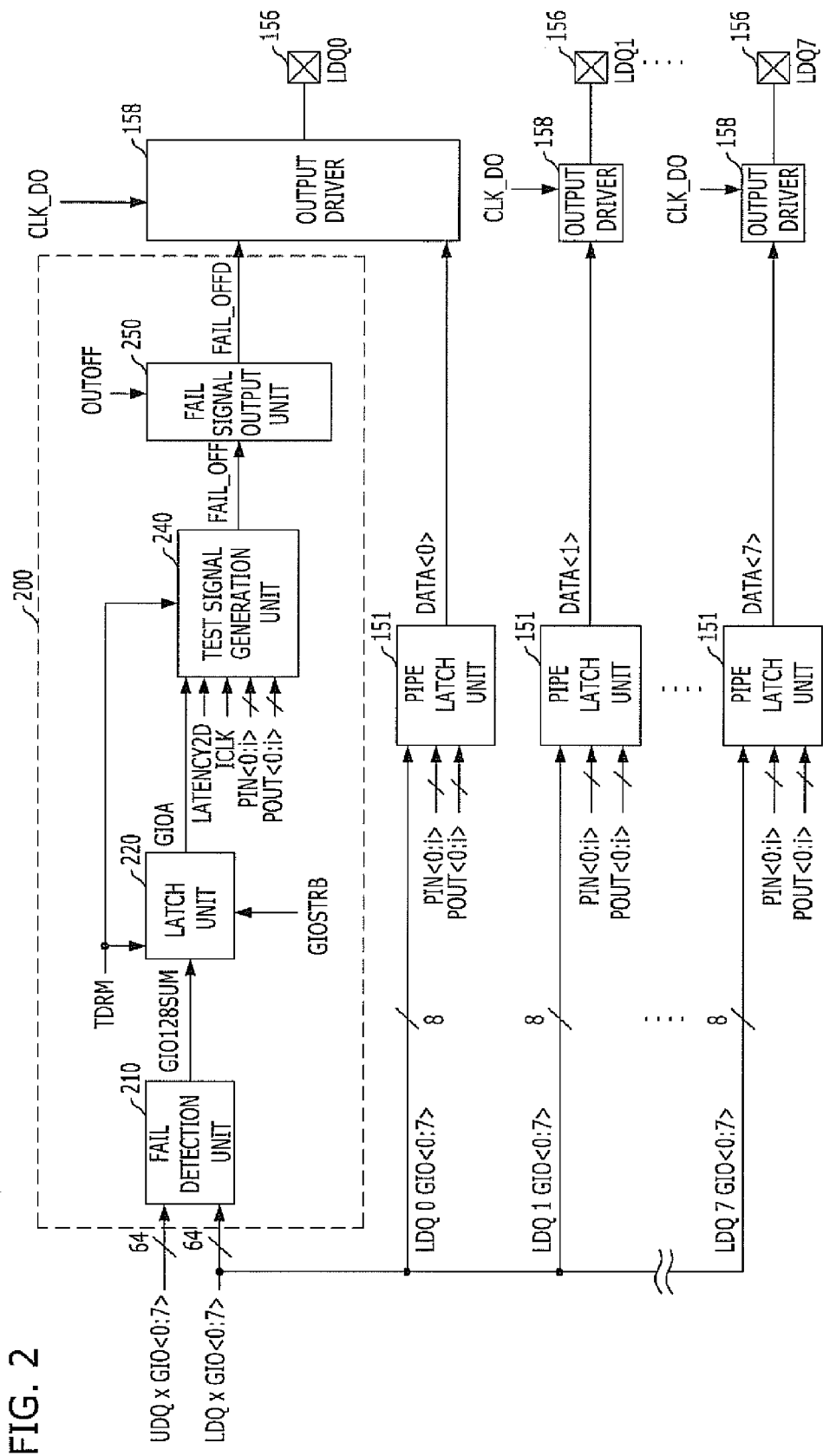
FIG. 2 is a block diagram illustrating a test mode control unit, an output driver, and a pipe latch unit shown in FIG. 1.

FIG. 2 is a block diagram illustrating the test mode control unit 200, output driver 158, and the pipe latch unit 151 shown in FIG. 1. Hereinafter, for sake of convenience, an exemplary case, in which 8 GIO lines GIO_U and 8 GIO lines GIO_L are provided, and 8 data pads LDQ and 8 data pads UDQ are provided will be explained.

Referring to FIG. 2, the test mode control unit 200 includes a fail detection unit 210 and a latch unit 220, and a test signal generation unit 240, and a fail signal output unit 250.

The fail detection unit 210 compares data UDQxGIO<0:7> of the GIO lines GIO_U with data LDQxGIO<0:7> of the GIO lines GIO_L to output a fail detection signal GIO128SUM. The fail detection signal GIO128SUM is inactivated when any of the data UDQxGIO<0:7> of the GIO lines GIO_U is different from a corresponding one of the data LDQxGIO<0:7> of the GIO lines.

The latch unit 220 latches the fail detection signal GIO128SUM to output a fail latch signal GIOA in response to the test mode signal TDRM, and a strobe signal GIOSTRB. The strobe signal GIOSTRB may be generated based on a pipe input strobe signal PINSTB used in the pipe latch units 151 and 169, which is synchronized with a read command. In accordance with this exemplary embodiment of the present invention, during the module test mode, the latch unit 220 outputs the fail latch signal GIOA by latching the fail detection signal GIO128SUM in synchronization with the strobe signal GIOSTRB which toggles whenever each read command is input.

The test signal generation unit 240 generates a test signal FAIL_OFF based on the fail latch signal GIOA, the test mode signal TDRM, a CAS latency signal LATENCY2D, an internal clock ICLK, pipe latch input control signals PIN<0:i>, and pipe latch output control signals POUT<0:i>.

The fail signal output unit 250 receives the test signal FAIL_OFF to output the fail-off signal FAIL_OFFD in response to an off-driver signal OUTOFF. Here, the off-driver signal OUTOFF is generated based on an inverted output enable signal, which is activated to a logic low level during a read operation, and inactivated to a logic high level after the read operation is finished. Here, the fail signal output unit 250 outputs the fail-off signal FAIL_OFFD to drive the first data pad LDQ0 to be a high-impedance state.

As describe above, in the normal mode, the pipe latch unit 151 receives the data LDQxGIO<0:7> from the GIO lines GIO_L, and output data DATA<0:7> to the output driver 158. As a result, the output driver 158 outputs the data DATA<0:7> to corresponding data pads among the first to eighth data pads LDQ0 to LDQ7, and thus the read operation is normally performed.

On the contrary, in the test mode, the test mode control unit 200 compares data UDQxGIO<0:7> of the GIO lines GIO_U with data LDQxGIO<0:7> of the GIO lines GIO_L, and outputs the fail-off signal FAIL_OFFD in response to a comparison result. As a result, when a fail occurs, the output driver 158 drives, for example, the first data pad LDQ0 to a high-impedance state in response to the fail-off signal FAIL_OFFD, and thus the first data pad LDQ0 shows a failure of the semiconductor memory device.

In FIG. 2, the fail-off signal FAIL_OFFD is input to the output driver 158 driving the first data pad LDQ0. However, in a preferred embodiment, the fail-off signal FAIL_OFFD may be input to all the output drivers 158 driving the first to eighth data pads LDQ0 to LDQ7 so that all the data pads LDQ0 to LDQ7 may denote a failure of the semiconductor memory device. In another embodiment, a switch unit may be provided between the fail signal output unit 250 and each of the output drivers 158 driving the second to eighth data pads LDQ1 to LDQ7. The switch unit may provide the fail-off signal FAIL OFFD to any number of selected output drivers 158 to control which of the data pads LDQ0 to LDQ7 indicate a failure of the semiconductor memory device. Further, the switch unit may be controlled by an external command, or may be implemented with a metal option.

Figure 3:
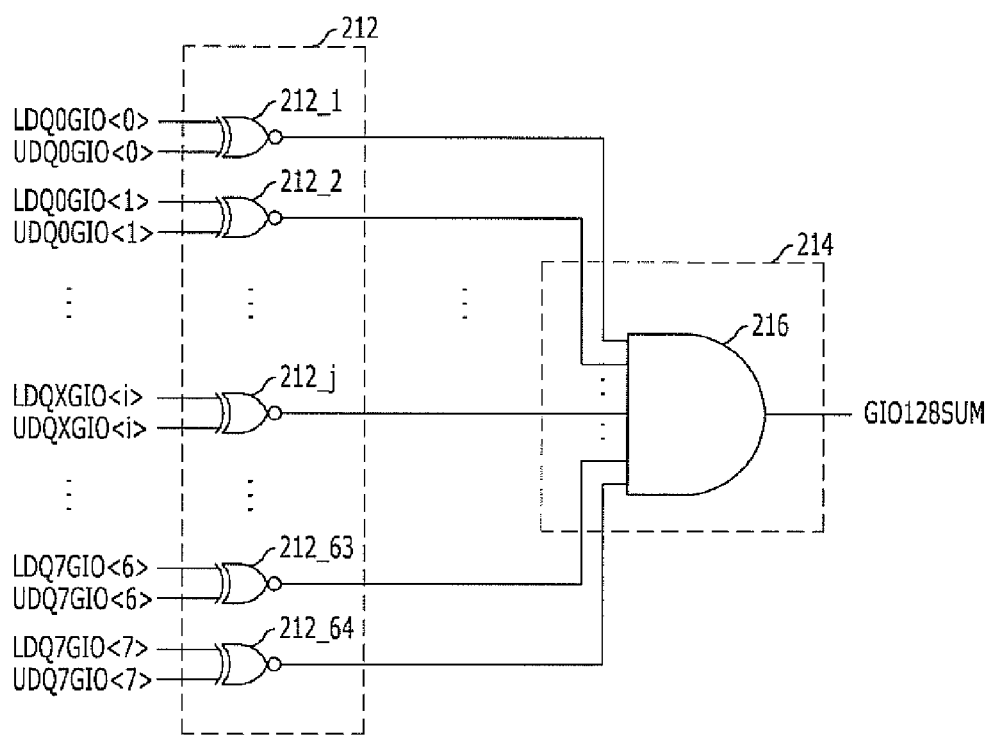
FIG. 3 is a circuit diagram illustrating a comparison unit shown in FIG. 2.

FIG. 3 is a circuit diagram illustrating the fail detection unit 210 shown in FIG. 2.

Referring to FIG. 3, the fail detection unit 210 includes a comparison unit 212 and a summation unit 214. The comparison unit 212 includes a plurality of, for example, XNOR gates 212_1 to 212_64 configured to receive the respective data UDQxGIO<0:7> and LDQxGIO<0:7>. The summation unit 214 includes, for example, an AND gate 216 configured to receive outputs of the plurality of XNOR gates 212_1 to 212_64.

Each of XNOR gates 212_1 to 212_64 activates its output signal when corresponding data UDQxGIO<0:7> and LDQx GIO<0:7> are identical with each other. The AND gate 216 activates the fail detection signal GIO128SUM when all the output signals of the XNOR gates 212_1 to 212_64 are activated, but inactivates the fail detection signal GIO128SUM when any one of the output signals of the XNOR gates 212_1 to 212_64 is inactivated.

Accordingly, the fail detection unit 210 inactivates the fail detection signal GIO128SUM when any one of the data UDQxGIO<0:7> is different from a corresponding one of the data LDQxGIO<0:7>.

Figure 4A:
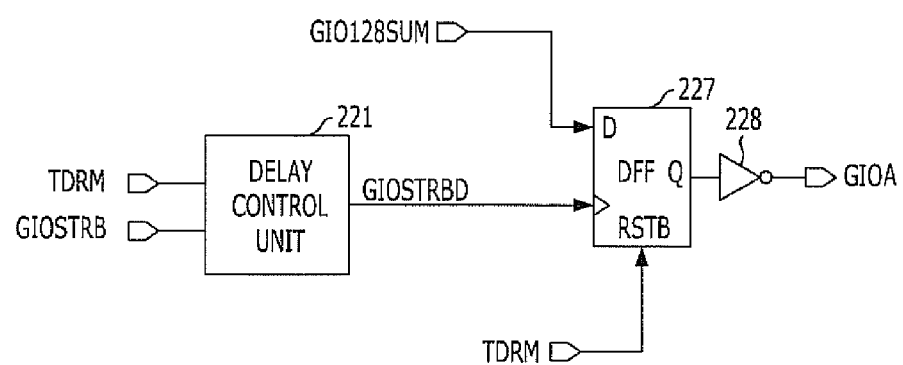
FIG. 4A is a circuit diagram illustrating a latch unit shown in FIG. 2.

FIG. 4A is a circuit diagram illustrating the latch unit 220 shown in FIG. 2.

Referring to FIG. 4A, the latch unit 220 includes a delay control unit 221, a D flip-flop 227, and an inverter 228.

The delay control unit 221 is enabled in response to the test mode signal TDRM, and delays the strobe signal GIOSTRB to output a delayed strobe signal GIOSTRBD. For reference, the delay control unit 221 delays the strobe signal GIOSTRB by a delay amount corresponding to a time taken by the fail detection unit 210 to generate the fail detection signal GIO128SUM. As a result, the delayed strobe signal GIOSTRBD is synchronized with the fail detection signal GIO128SUM. Here, the strobe signal GIOSTRB is generated based on a pipe input strobe signal PINSTB which is generated in synchronization with a read command. The D flip-flop 227 latches the fail detection signal GIO128SUM in synchronization with the delayed strobe signal GIOSTRBD. Herein, the D flip-flop 227 is reset in response to the test mode signal TDRM. Finally, the inverter 228 outputs the fail latch signal GIOA by inverting an output signal of the D flip-flop 227.

Hereinafter, referring to FIGS. 4A and 4B, an operation of the latch unit 220 will be explained in detail.

Figure 4B:
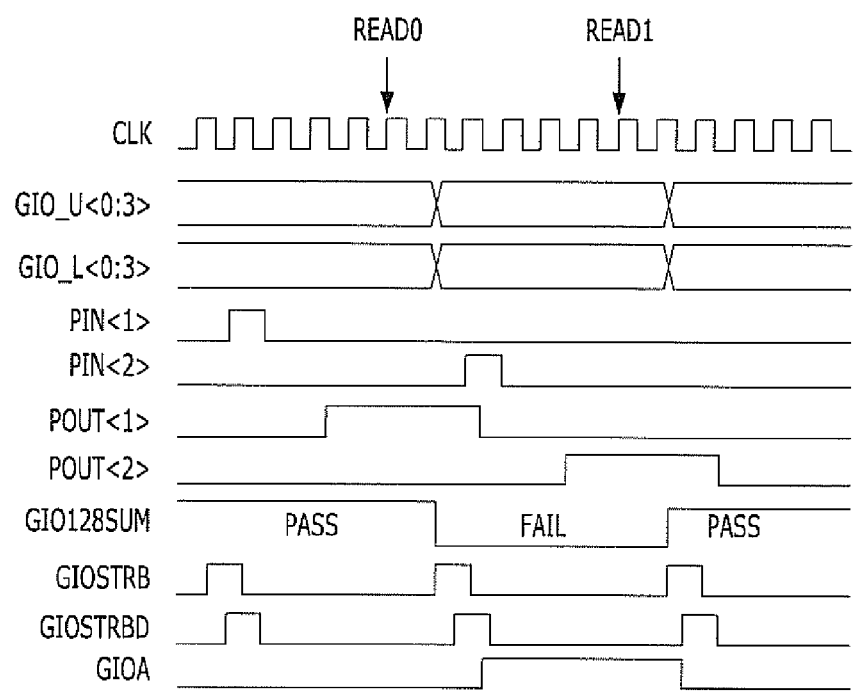
FIG. 4B is a timing diagram illustrating an operation of the latch unit in accordance with an exemplary embodiment of the present invention.

FIG. 4B is a timing diagram illustrating an operation of the latch unit 220.

In a test mode, test data are input from the data pad LDQ and transferred to the respective memory cells in the banks.

After a read command is input, the test data stored in the respective memory cells in the banks are loaded on the corresponding GIO lines GIO_L and GIO_U as data UDQx GIO<0:7> and LDQxGIO<0:7>. The delay control unit 221 of the latch unit 220 is enabled in response to the test mode signal TDRM, and outputs the delayed strobe signal GIOSTRBD by delaying the strobe signal GIOSTRB. The D flip-flop 227 latches the fail detection signal GIO128SUM in synchronization with the delayed strobe signal GIOSTRBD. Finally, the inverter 228 outputs the fail latch signal GIOA by inverting the output signal of the D flip-flop 227.

It is assumed that the fail detection signal GIO128SUM becomes inactivated in the module test mode. At this time, the D flip-flop 227 latches the fail detection signal GIO128SUM whenever the read command is input. Accordingly, in the module test mode, the latch unit 220 outputs the fail latch signal GIOA by detecting a fail status in real-time in synchronization with the delayed strobe signal GIOSTRBD, which continuously toggles at each read operation.

Figure 5:
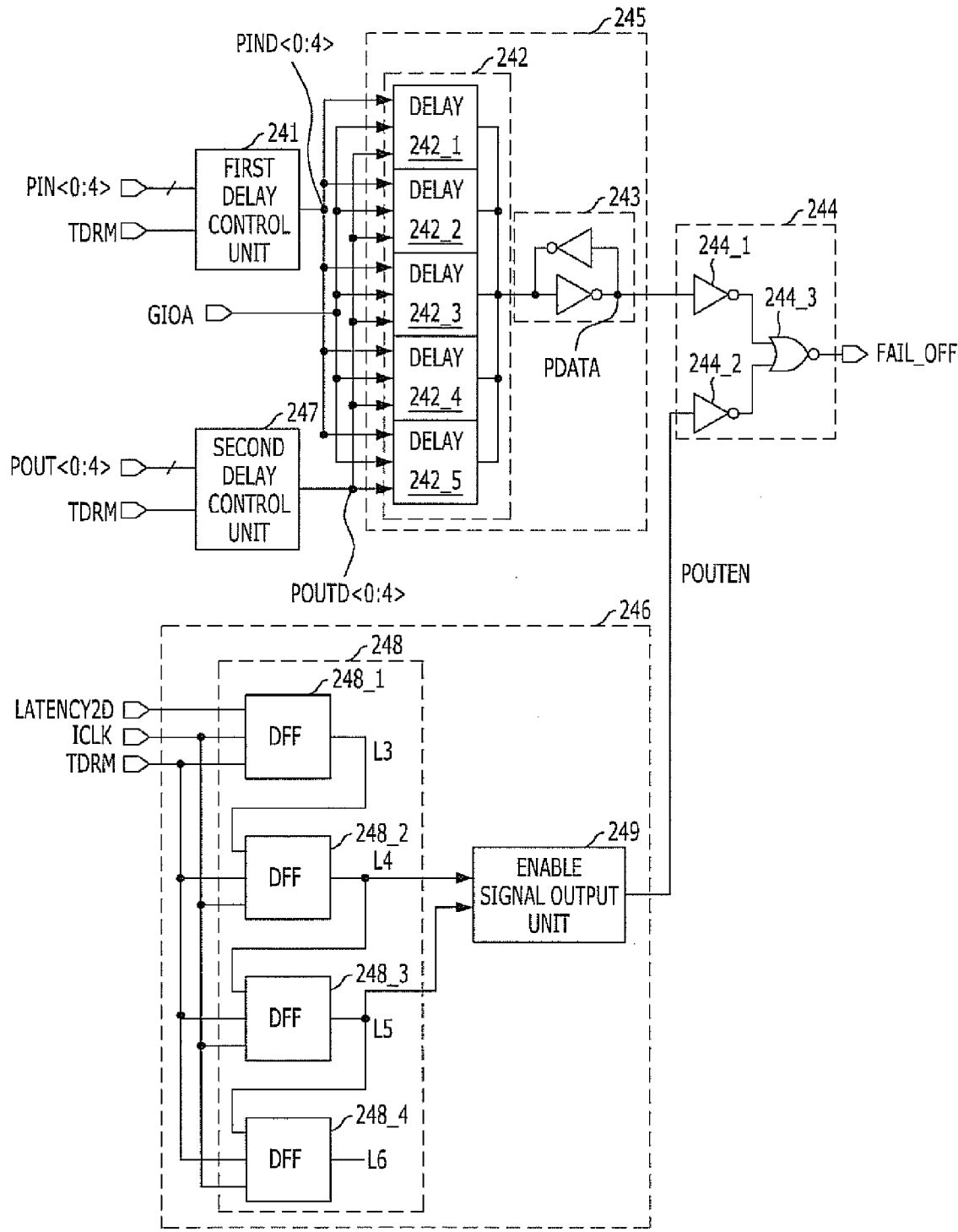
FIG. 5 is a block diagram illustrating a test signal generation unit shown in FIG. 2.

FIG. 5 is a block diagram illustrating the test signal generation unit 240 shown in FIG. 2.

Referring to FIG. 5, the test signal generation unit 240 includes first and second delay control units 241 and 247, a pipe latch unit 245, an output enable signal generation unit 246, and a combination unit 244.

The first delay control unit 241 is enabled in response to the test mode signal TDRM, and delays pipe latch input control signals PIN<0:4> to output delayed pipe latch input control signals PIND<0:4> to the pipe latch unit 245. The second delay control unit 247 is enabled in response to the test mode signal TDRM, and delays pipe latch output control signals POUT<0:4> to output delayed pipe latch output control signals POUTD<0:4> to the pipe latch unit 245. Here, the pipe latch input control signals PIN<0:4> are signals used to receive normal data in the pipe latch units 151 and 169 shown in FIG. 1, and the pipe latch output control signals POUT<0:4> are signals used to output the normal data in the pipe latch units 151 and 169 shown in FIG. 1. For reference, a delay amount of the first and second delay control units 241 and 247 corresponds to a time taken to synchronize the fail latch signal GIOA with the pipe latch input control signals PIN<0:4> and the pipe latch output control signals POUT<0:4>, respectively.

The pipe latch unit 245 sequentially latches the fail latch signal GIOA in synchronization with the delayed pipe latch input control signals PIND<0:4> and the delayed pipe latch output control signals POUTD<0:4>, and outputs a pipe output data PDATA. In more detail, the pipe latch unit 245 includes an alignment unit 242 and an inverter latch unit 243. The alignment unit 242 includes a plurality of delay units 242_1 to 242_5, each sequentially receiving the fail latch signal GIOA in response to the respective delayed pipe latch input control signals PIND<0:4>, and sequentially outputting the received data in response to the respective delayed pipe latch output control signals POUTD<0:4>. The inverter latch unit 243 includes two inverts, and inverts and latches an output of the alignment unit 242 to output the pipe output data PDATA.

The output enable signal generation unit 246 generates a pipe latch output enable signal POUTEN by shifting the CAS latency signal LATENCY2D to be in synchronization with the internal clock ICLK, in the module test mode. In more detail, the output enable signal generation unit 246 includes a shift unit 248, and an enable signal output unit 249. The shift unit 248 is enabled in response to the test mode signal TDRM, and shifts the CAS latency signal LATENCY2D in synchronization with the internal clock ICLK. The enable signal output unit 249 receives an output signal of the shift unit 248 to output the pipe latch output enable signal POUTEN.

In the preferred embodiment, the shift unit 248 includes a plurality of D flip-flops 248_1 to 248_5, each being reset in response to the test mode signal TDRM. The first D flip-flop 248_1 latches the CAS latency signal LATENCY2D in synchronization with the internal clock ICLK, and the second to fifth D flip-flops 248_2 to 248_5 latch an output of the previous D flip-flop in synchronization with the internal clock ICLK. Herein, the CAS latency signal LATENCY2D is activated in response to a CAS latency after the read command is input. In the preferred embodiment, the enable signal output unit 249 receives an output L4 of the second D flip-flop 248_2 and an output L5 of the third D flip-flop 248_3 to generate the pipe latch output enable signal POUTEN which maintains an activated logic level for a duration between activation timings of the output L4 and the output L5. Although the preferred embodiment uses the output L4 and the output L5, the present invention is not limited to this structure. For example, the enable signal output unit 249 may use outputs L3 and L4, or outputs L5 and L6.

The combination unit 244 receives the pipe output data PDATA and the pipe latch output enable signal POUTEN and outputs the test signal FAIL_OFF. In detail, the combination unit 244 includes first and second inverters 244_1 and 244_2, and a NOR gate 244_3. The first inverter 244_1 receives the pipe output data PDATA, and the second inverter 244_2 receives the pipe latch output enable signal POUTEN. The NOR gate 244_3 performs a NOR operation on outputs of the first and second inverters. Accordingly, the combination unit 244 activates the test signal FAIL_OFF when the pipe output data PDATA is activated during the activation duration of the pipe latch output enable signal POUTEN.

As described above, in this embodiment of the present invention, the test signal generation unit 240 is implemented with a pipe latch circuit substantially identical to that used in the pipe latch units 151 and 169 shown in FIG. 1. Accordingly, a timing for outputting the test signal FAIL_OFF may be synchronized with a timing for outputting data through the DQ pads LDQ and UDQ.

Figure 6:
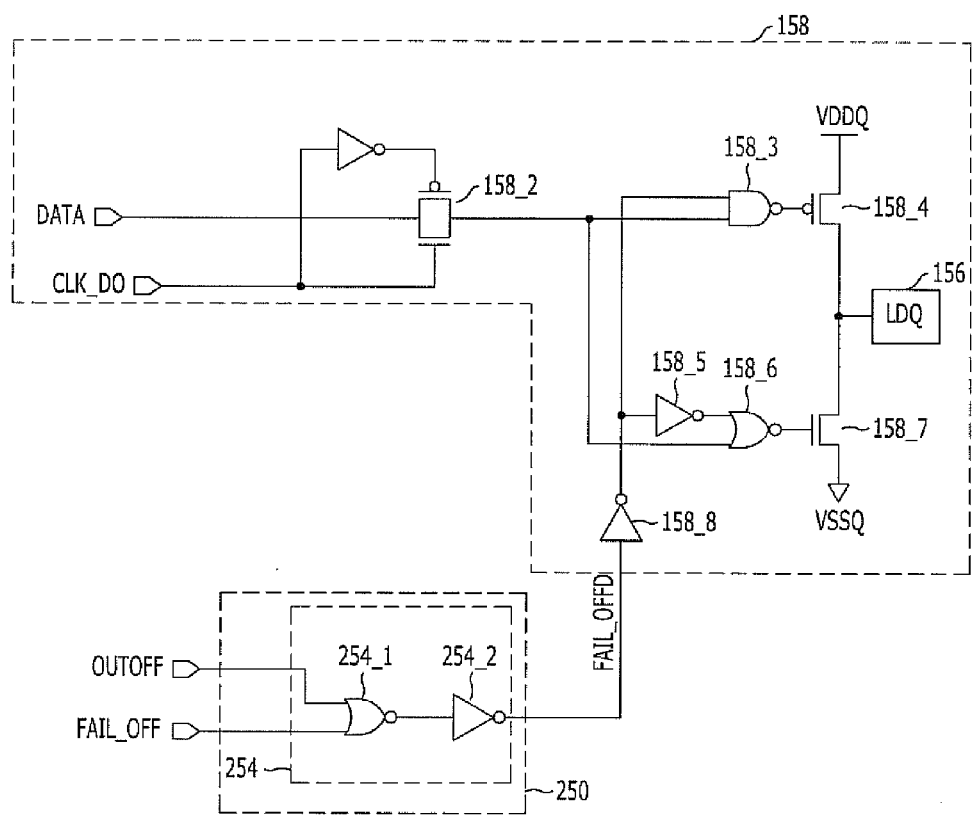
FIG. 6 is a circuit diagram illustrating a fail signal output unit and an output driver shown in FIG. 2.

FIG. 6 is a circuit diagram illustrating the fail signal output unit 250 and the output driver 158 shown in FIG. 2.

Referring to FIG. 6, the fail signal output unit 250 includes a fail-off signal output unit 254. The fail-off signal output unit 254 receives the test signal FAIL_OFF and outputs the fail-off signal FAIL_OFFD in response to the off-driver signal OUTOFF. For reference, the off-driver signal OUTOFF is activated to a logic low level during a read operation, and inactivated to a logic high level after the read operation is finished.

The fail-off signal output unit 254 includes a first NOR gate 254_1 and a first inverter 254_2. The first NOR gate 254_1 and the first inverter 254_2 perform an OR operation on the test signal FAIL_OFF and the off-driver signal OUTOFF. That is, the fail-off signal output unit 254 outputs the fail-off signal FAIL_OFFD when any of the test signal FAIL_OFF, and the off-driver signal OUTOFF is activated.

Meanwhile, the output driver 158 includes a transfer gate 158_2, a NAND gate 158_3, a NOR gate 158_6, inverters 158_5 and 158_8, a pull-up driver 158_4, and a pull-down driver 158_7.

The transfer gate 158_2 receives input data DATA in response to a clock signal CLK_DO. The inverter 158_8 outputs the inverted signal of the fail-off signal FAIL_OFFD by inverting the fail-off signal FAIL_OFFD, and the inverter 158_5 inverts an output of the inverter 158_8 to output a signal having a phase substantially the same as the fail-off signal FAIL_OFFD. The NAND gate 158_3 performs a NAND operation on an output of the transfer gate 158_2 and an inverted signal of the fail-off signal FAIL_OFFD. The NOR gate 158_6 performs a NOR operation on the output of the transfer gate 158_2 and an output of the inverter 158_5. The pull-up driver 158_4 and pull-down driver 158_7 are turned on/off in response to outputs of the NAND gate 158_3 and the NOR gate 158_6, respectively.

In the normal mode, the test signal FAIL_OFF is inactivated. During a read operation, the output driver 158 pull-up or pull-down drives the input data DATA in response to the clock signal CLK_DO. After the read operation is finished, since the off-driver signal OUTOFF is activated, the fail-off signal FAIL_OFFD is activated, and thus both the pull-up driver 158_4 and the pull-down driver 158_7 are turned off. As a result, the data pad LDQ is in a high-impedance state after the read operation is finished.

During the module test mode, the fail-off signal output unit 254 outputs the fail-off signal FAIL_OFFD based on the test signal FAIL_OFF and the off-driver signal OUTOFF. When the fail-off signal FAIL_OFFD is activated due to a failure, both the pull-up driver 158_4 and the pull-down driver 158_7 are turned off. As a result, the data pad LDQ is in a high-impedance state.

Hereinafter, referring to FIGS. 1 to 7B, an operation of the semiconductor memory device is explained in more detail.

Figure 7A:
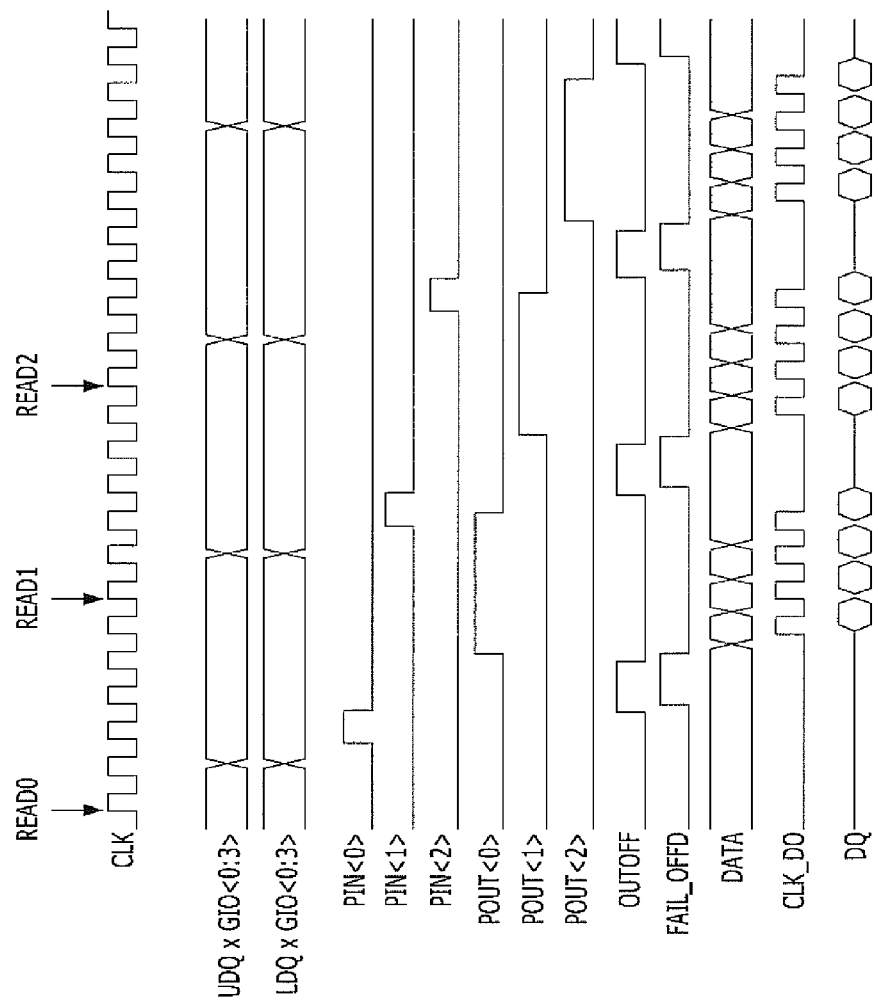
FIGS. 7A and 7B are timing diagrams illustrating an operation of a semiconductor memory device in accordance with an exemplary embodiment of the present invention.
Figure 7B:
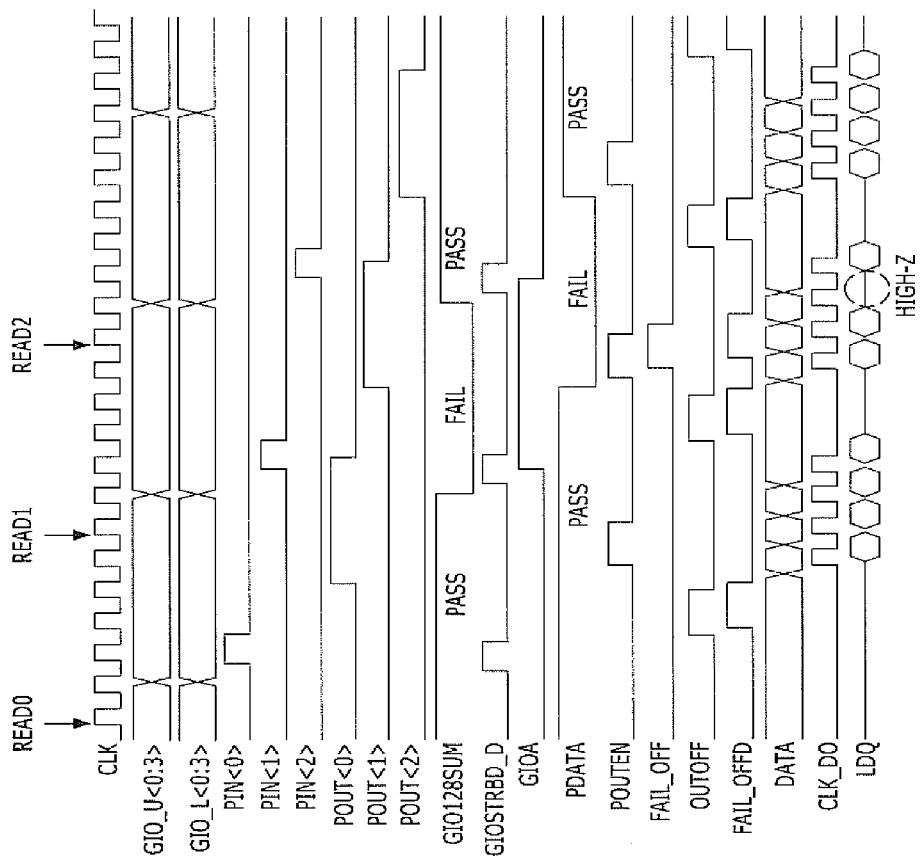

FIGS. 7A and 7B are timing diagrams illustrating an operation of a semiconductor memory device in accordance with an exemplary embodiment of the present invention. More specifically, FIG. 7A is a timing diagram illustrating an operation in the normal mode, and FIG. 7B is a timing diagram illustrating an operation of the module test mode.

Referring to FIG. 7A, in the normal mode, data stored in the respective memory cells in the banks are loaded on the corresponding GIO lines GIO_L and GIO_U when a read command is input. The pipe latch units 151 and 169 receive and latch the data of the GIO lines GIO_L and GIO_U in response to the pipe latch input control signals PIN<0:4>, and output the data to the data pads LDQ and UDQ in response to the pipe latch output control signals POUT<0:4>. For reference, the off-driver signal OUTOFF is inactivated to a logic low level during each read operation, and activated to a logic high level after each read operation is finished. The fail-off signal output unit 254 outputs the fail-off signal FAIL_OFFD in response to the off-driver signal OUTOFF after each read operation is finished. Accordingly, both of the pull-up driver 158_4 and the pull-down driver 158_7 are turned off, and thus the data pad LDQ is in a high-impedance state whenever each read operation is finished.

Referring to FIG. 7B, in the module test mode, data stored in the respective memory cells of the banks are loaded on the corresponding GIO lines GIO_L and GIO_U when a read command is input. The fail detection unit 210 compares data UDQ×GIO<0:7> of the GIO lines GIO_U with data LDQ×GIO<0:7> of the GIO lines GIO_L to output the fail detection signal GIO128SUM. The latch unit 220 latches the fail detection signal GIO128SUM in response to the strobe signal GIOSTRB activated in synchronization with each read command.

When any of the data UDQ×GIO<0:7> of the GIO lines GIO_U is different from a corresponding one of the data LDQ×GIO<0:7> of the GIO lines GIO_L, the fail detection signal GIO128SUM is inactivated and the fail latch signal GIOA is activated. At this time, the D flip-flop 227 latches the fail detection signal GIO128SUM whenever the read command is input. Accordingly, in the module test mode, the latch unit 220 outputs the fail latch signal GIOA by detecting a fail status in real-time.

Meanwhile, the test signal generation unit 240 receives the fail latch signal GIOA to generate the test signal FAIL_OFF in response to the CAS latency signal LATENCY2D, the internal clock ICLK, the pipe latch input control signals PIN<0:4>, and the pipe latch output control signals POUT<0:4>.

In more detail, the pipe latch unit 245 of the test signal generation unit 240 latches the fail latch signal GIOA in synchronization with the delayed pipe latch input control signals PIND<0:4> and the delayed pipe latch output control signals POUTD<0:4>, and outputs the pipe output data PDATA. The output enable signal generation unit 246 shifts the CAS latency signal LATENCY2D in synchronization with the internal clock ICLK, and outputs the pipe latch output enable signal POUTEN. Herein, the pipe output data PDATA is output at a timing synchronized with a timing for outputting data in the pipe latch units 151 and 169, and the pipe latch output enable signal POUTEN is activated for a certain duration after a corresponding one of the pipe latch output control signals POUT<0:4> is activated. The combination unit 244 activates the test signal FAIL_OFF when the pipe output data PDATA is activated during the activation duration of the pipe latch output enable signal POUTEN.

The fail-off signal output unit 254 activates the fail-off signal FAIL_OFFD in response to an activation of the test signal FAIL_OFF or the off-driver signal OUTOFF. During the read operation, when the fail-off signal FAIL_OFFD is activated in response to the test signal FAIL_OFF due to a fail, both the pull-up driver 158_4 and the pull-down driver 158_7 are turned off. As a result, when a fail occurs in the module test mode, the data pad LDQ is in a high-impedance state in real-time during the respective read operation. Further, after each read operation is finished, the fail-off signal FAIL_OFFD is activated in response to the off-driver signal OUTOFF, which is activated whenever each read operation is finished. Accordingly, both the pull-up driver 158_4 and the pull-down driver 158_7 are turned off, and thus the data pad LDQ is in a high-impedance state whenever each read operation is finished.

In accordance with an exemplary embodiment of the present invention, in a test mode, data input from a data pad LDQ are simultaneously transferred to both GIO lines GIO_L and GIO_U, which are coupled to a plurality of unit cells in banks, and a test mode control unit compares data of the GIO lines GIO_U with data of the GIO lines GIO_L to output a fail signal based on a comparison result. Accordingly, a time for testing the plurality of unit cells in the banks can be reduced/decreased.

Furthermore, in accordance with an exemplary embodiment of the present invention, various methods for denoting a fail status in a test mode, such as a module test, are provided. For example, in the module test mode, the test mode control unit outputs the fail signal in real-time by detecting a defect of the memory cells whenever a read command is input, and whenever the memory cells having a defect are detected, the output driver drives the DQ pad LDQ to a high-impedance state at the same time when a respective data is output.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, any numbers of elements illustrated and described herein are by way of example only. The present invention is limited only as defined in the following claims and equivalents thereof.

What is claimed is:

1. A semiconductor memory device, comprising:
    a plurality of banks, each including a plurality of first memory cells and a plurality of second memory cells;
    a first input/output unit configured to transfer first data between the first memory cells and a plurality of first data pads;
    a second input/output unit configured to transfer second data between the second memory cells and a plurality of second data pads;
    a path selection unit configured to transfer the first data, which are input through the first data pads, to both the first and second memory cells, during a test mode; and
    a test mode control unit configured to compare the first data of the first and second memory cells, and to control at least one of the first data pads to denote a fail status based on a comparison result, during the test mode, wherein the test mode control unit controls the one of the first data pads to a high-impedance state during a read operation,
    wherein the test mode control unit comprises:
    a fail detection unit configured to compare the first data of the first memory cells with the first data of the second memory cells and to output a fail detection signal based on the comparison result;
    a latch unit configured to latch the fail detection signal and to output a fail latch signal in response to a test mode signal which is activated during the test mode, and a strobe signal which is toggled when a read command is input;
    a test signal generation unit configured to generate a test signal by synchronizing the fail latch signal to an output timing of data through the data pad in response to the test mode signal; and
    a fail signal output unit configured to output a fail signal in response to the test signal and an off-driver signal, which is inactivated during a read operation.

2. The semiconductor memory device of claim 1, further comprising an input/output driver configured to drive the one of the first data pads to denote a fail status in response to the fail signal.

3. The semiconductor memory device of claim 1, wherein the fail detection unit comprises:
    a plurality of comparison units configured to compare the first data of the first memory cells with the first data of the second memory cells; and
    a summation unit configured to output the fail detection signal based on outputs of the comparison units.

4. The semiconductor memory device of claim 3, wherein the comparison units each comprise an XNOR gate, each of which activates its output signal when corresponding first data are identical with each other.

5. The semiconductor memory device of claim 3, wherein the summation unit comprises a logic gate to perform an AND operation on the outputs of the comparison units.

6. The semiconductor memory device of claim 1, wherein the latch unit outputs the fail latch signal by latching the fail detection signal in synchronization with the strobe signal.

7. The semiconductor memory device of claim 1, wherein the latch unit includes:
    a delay control unit configured to delay the strobe signal and to output a delayed strobe signal; and
    a D flip-flop configured to output the fail latch signal by latching the fail detection signal in synchronization with the delayed strobe signal.

8. The semiconductor memory device of claim 7, wherein the delay control unit has a delay amount corresponding to a time taken to generate the fail detection signal by the fail detection unit so as to synchronize the delayed strobe signal with the fail detection signal.

9. The semiconductor memory device of claim 7, wherein the delay control unit and the D flip-flop are enabled in response to the test mode signal.

10. The semiconductor memory device of claim 1, wherein the test signal generation unit generates the test signal by synchronizing the fail latch signal to an output timing of data through the first and second data pads.

11. The semiconductor memory device of claim 1, wherein the test signal generation unit comprises:
    a delay control unit configured to delay a pipe latch control signal and to output a delayed pipe latch control signal;
    a pipe latch unit configured to sequentially latch the fail latch signal in synchronization with the delayed pipe latch control signal, and output a pipe output data;
    an output enable signal generation unit configured to generate a pipe latch output enable signal by shifting a CAS latency signal in synchronization with an internal clock signal; and
    a combination unit configured to output the test signal based on the pipe output data and the pipe latch output enable signal.

12. The semiconductor memory device of claim 11, wherein the delay control unit has a delay amount corresponding to a time taken to synchronize the fail latch signal with the pipe latch control signal.

13. The semiconductor memory device of claim 11, wherein the delay control unit and the output enable signal generation unit are enabled in response to the test mode signal.

14. The semiconductor memory device of claim 11, wherein the pipe latch unit comprises:

an alignment unit configured to align the fail latch signal in synchronization with the delayed pipe latch control signal; and an inverter latch unit configured to invert and latch an output of the alignment unit to output the pipe output data.

15. The semiconductor memory device of claim 14, wherein the alignment unit comprises a plurality of delay units, each sequentially receiving the fail latch signal, and sequentially outputting the received data, in response to the respective delayed pipe latch control signal.

16. The semiconductor memory device of claim 11, wherein the output enable signal generation unit comprises:

a shift unit configured to shift the CAS latency signal in synchronization with the internal clock signal; and an enable signal output unit configured to output the pipe latch output enable signal based on an output signal of the shift unit.

17. The semiconductor memory device of claim 16, wherein the shift unit comprises a plurality of D flip-flops, wherein a first D flip-flop latches the CAS latency signal in synchronization with the internal clock signal, and the other D flip-flops latch an output of the previous D flip-flop in synchronization with the internal clock signal.

18. The semiconductor memory device of claim 17, wherein the enable signal output unit generates the pipe latch output enable signal having an activated logic level for a duration between outputs of adjacent D flip-flops.

19. The semiconductor memory device of claim 11, the combination unit comprises:

first and second logic gates configured to invert the pipe output data and the pipe latch output enable signal, respectively; and a third logic gate configured to perform a NOR operation on outputs of the first and second logic gates to output the second test mode signal.

20. The semiconductor memory device of claim 1, wherein the fail signal output unit comprises:

a first logic gate configured to perform a NOR operation on the test signal and the off-driver signal; and a second logic gate configured to invert an output of the first logic gate and to output the fail signal.

21. A method for testing a semiconductor memory device, the method comprising:

transferring data, which is input through a data pad, to first and second memory cells of a bank;

comparing the data of the first memory cell with the data of the second memory cell to output a fail detection signal based on the comparison result;

generating a fail latch signal by latching the fail detection signal in response to a test mode signal which is activated during the test mode, and a strobe signal which is toggled when a read command is input;

generating a test signal by synchronizing the fail latch signal to an output timing of data through the data pad in response to the test mode signal;

outputting a fail signal based on the test signal and an off-driver signal, which is inactivated during a read operation; and driving at least one of the data pad to denote a fail status based on the fail signal, wherein the data is driven to a high-impedance state during a read operation.

22. The method of claim 21, the fail latch signal is generated by latching the fail detection signal in synchronization with the strobe signal.

23. The method of claim 21, wherein the generating of the fail latch signal comprises:

delaying the strobe signal to output a delayed strobe signal; and outputting the fail latch signal by latching the fail detection signal in synchronization with the delayed strobe signal.

24. The method of claim 23, wherein a delay amount is determined based on a time taken to synchronize the delayed strobe signal with the fail detection signal.

25. The method of claim 21, wherein the generating of the test signal comprises:

delaying a pipe latch control signal and to output a delayed pipe latch control signal;

sequentially latching the fail latch signal in synchronization with the delayed pipe latch control signal, and output a pipe output data;

generating a pipe latch output enable signal by shifting a CAS latent signal in synchronization with an internal clock signal; and outputting the test signal based on the pipe output data and the pipe latch output enable signal.

\* \* \* \* \*